United States Patent [19]

Satterwhite

[11] Patent Number: 4,942,365
[45] Date of Patent: Jul. 17, 1990

[54] SYNCHRONOUS PHASE AND/OR FREQUENCY DETECTION SYSTEM

[75] Inventor: James R. Satterwhite, Roxboro, N.C.

[73] Assignee: Teltest Electronics Laboratories, Inc., Roxboro, N.C.

[21] Appl. No.: 384,414

[22] Filed: Jul. 24, 1989

[51] Int. Cl.$^5$ ............................ H03L 7/00; H03K 9/06
[52] U.S. Cl. ..................................... 328/134; 328/133;
328/140; 307/511; 307/526; 307/527
[58] Field of Search .................... 328/133, 134, 32, 26,
328/140; 307/511, 512, 516, 271, 529, 240, 525,
526, 527

[56] References Cited

U.S. PATENT DOCUMENTS 4,516,042  5/1985  Nakamura ............................ 307/542
4,675,613  6/1987  Naegeli et al. ....................... 328/133
4,675,614  6/1987  Gehrke ................................ 328/133

Primary Examiner—Timothy P. Callahan
Attorney, Agent, or Firm—Olive & Olive

[57] ABSTRACT

A circuit and method for detecting and determining the magnitude of either a synchronous frequency signal whose phase relationship to a reference signal is known or unknown or a non-synchronous signal near the reference frequency is based on using a pair of synchronous detectors one of which develops a COS Output and the other of which develops a SIN Output. The input sides of both synchronous detectors are connected to receive the signal being processed. The synchronous detector which develops the COS Output is connected to a first reference signal and the other synchronous detector input is connected to a second reference signal having a plus 90 degree phase relationship with the first reference signal. The COS Output and SIN Output are fed through a chopper analog switch controlled by a chop frequency and then to a RMS detector which develops the desired output.

9 Claims, 4 Drawing Sheets

SYNCHRONOUS PHASE AND/OR FREQUENCY DETECTION SYSTEM

FIELD OF INVENTION

The invention relates to electrical signal detectors and more specifically to a circuitry and a method utilizing synchronous techniques for detecting and determining the magnitude of a signal synchronous with a reference frequency and whose phase relationship to the reference frequency is either known or unknown or a signal which is near but not synchronous with the reference frequency.

BACKGROUND ART

The synchronous detector, also known as a coherent detector, phase detector, or balanced demodulator, provides a means for detecting synchronous signals in the presence of noise and other interfering signals. The term "synchronous signal" is meant to mean a signal which is synchronous with a reference frequency. The synchronous detector can be configured for extremely narrow bandwidths, which is equivalent to very high Q's, without the sensitive circuits usually required for analog filters at the signal frequency. The synchronous detector is indeed a detector and a filter.

The basic synchronous detector has many implementations. One implementation is shown in FIG. 1. Here the input signal is fed to an inverting amplifier with a gain of one, such that given that the input signal is s(t) the output of the inverter is −s(t). The signal and its inverse are switched by an analog switch driven at the same or synchronous frequency. The analog switch is such that when the digital reference signal is low the inverse is connected to the input of the low-pass filter and when the digital reference signal is high the signal is connected directly to the input of the low-pass filter. The resulting waveform is shown at the output of the switch. For these conditions, the result resembles a fullwave rectified waveform. The switch output waveform is the result of the frequency and phase relationship between the digital reference signal and the input signal. The switch output signal is passed through a low pass filter. The low-pass filter removes the AC components of the waveform giving the average value as a DC voltage at the output. In this case the output is a DC voltage whose magnitude is 0.636 times the peak value of the input wave.

FIG. 2 shows the waveform for various values of the phase angle. In general, if the relative phase of the input signal to the reference is "a" degrees then the output is given by:

$$OUTPUT = 0.636 \times PEAK\ SIGNAL \times \cos(a).$$

For a quick look at synchronous detection bandwidth, the process of synchronous detection involves multiplying the incoming signal with a squarewave. The result of this product are the sum and difference frequencies of the squarewave and the input signal which includes, for synchronous frequency inputs, a DC term. The low-pass filter, given that the corner is properly set and the input is synchronous, removes all but the DC term.

The corner frequency is defined as that frequency where the signal at the output is attenuated by 3 dB. The filter is said to pass frequencies below the corner and to reject frequencies above the corner. For non-synchronous signals, products below the low pass filter corner are seen in the output. Therefore, the corner of the low-pass filter determines the bandwidth of the detector. The detector rejects all frequencies in the input spectra whose difference from the reference frequency is greater than one half the bandwidth. This can result in some very narrow bandwidths. For example, consider a reference frequency of 100 KHz and a low-pass filter corner of 1 Hz. This results in a detector with a bandwidth of 2 Hz at 100 KHz and something like a Q of 50000. The detector is stable at this Q level because the circuit is not dependent on critically tuned elements. High quality, stable low-pass filters are simple to construct and maintain.

For simplicity, an anti-aliasing prefilter has not been included in FIG. 1. The anti-aliasing filter is used to prevent interference signals whose frequency is near one of the harmonics of the reference frequency from giving an output. Typically the anti-aliasing filter is a low-pass filter with a corner between the reference frequency and its first harmonic. This would be necessary since the synchronous detector also has DC terms for the odd harmonics of the reference signal. The requirements of the prefilter are not severe.

A useful expansion of the synchronous detector circuit shown in FIG. 1 adds another synchronous detector driven by the reference plus 90 degrees. This is shown in FIG. 3. This allows COS (Cosine) and SIN (Sine) outputs whose relation to each other is as follows:

$$COS\ Output = 0.636 \times Peak\ Signal \times \cos(a),$$

$$SIN\ Output = 0.636 \times Peak\ Signal \times \sin(a).$$

The synchronous detector has been implemented in many forms and in many products over a long period of time. However, there remains a need for a simple method for detecting and determining the magnitude of either a synchronous frequency signal whose phase relationship to a reference frequency is unknown or a non-synchronous signal near the reference frequency. For a synchronous signal whose phase relationship to the reference signal is unknown or variable there is little meaning to the output of the two detectors illustrated in FIG. 3 without further processing. One method of further processing is to compute the root-mean-square (RMS) of the COS Output and the SIN Output. Dynamically, this method is cumbersome and slow using a computer or inaccurate and tricky using analog multipliers. Thus, what is needed is a fast, accurate system and method which can be employed dynamically and which becomes the primary object of the invention. Other objects will become apparent as the description proceeds.

SUMMARY OF INVENTION

The invention provides circuitry and a method of detecting and determining dynamically, i.e. in real time, the magnitude of either a synchronous frequency whose phase relationship to a reference frequency is known or unknown or a non-synchronous signal near the reference frequency. The circuitry uses two synchronous detectors followed by a chopper followed by an RMS detector from which the output signal is obtained. One synchronous detector develops a COS Output and the other synchronous detector develops a SIN Output.

The chopper alternately switches between the COS Output and the SIN Output.

DESCRIPTION OF PREFERRED EMBODIMENT

Figure 4:
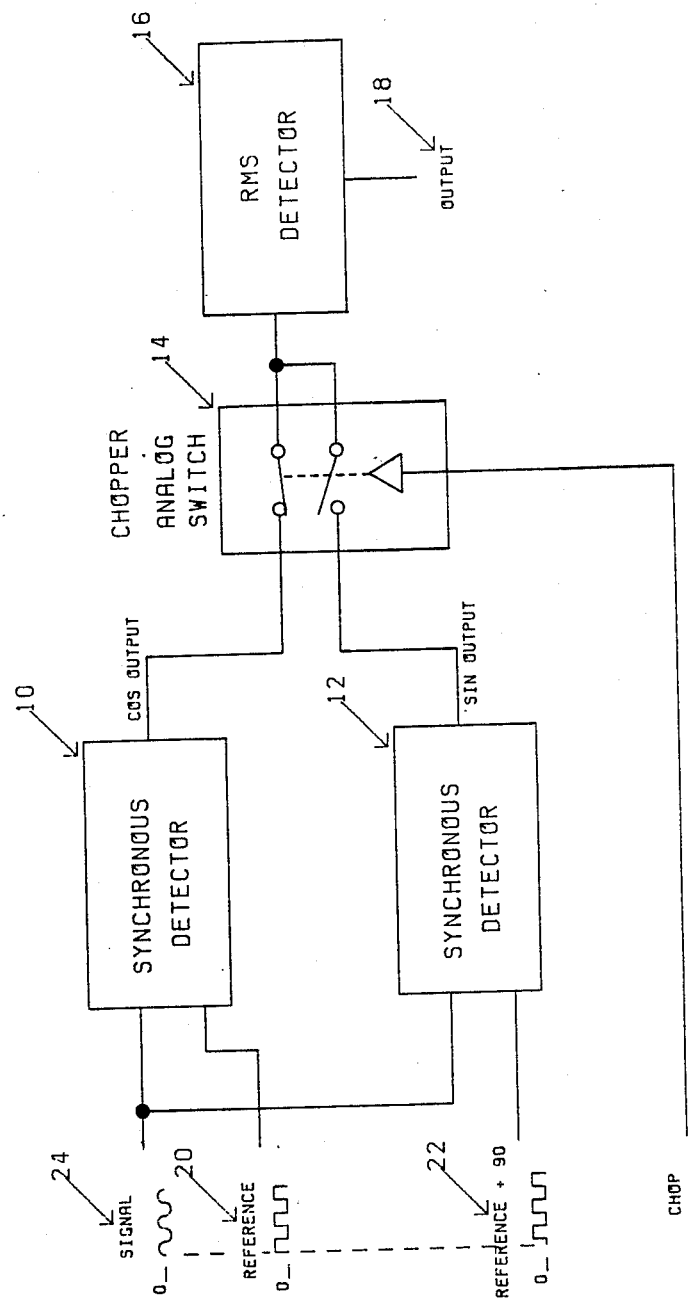
FIG. 4 illustrates a circuit and method according to the invention providing means for detecting and determining the magnitude of either a synchronous frequency signal whose phase relationship to a reference frequency is unknown or a non-synchronous signal near the reference frequency.

The invention circuitry is shown by way of example in FIG. 4.

Figure 1:
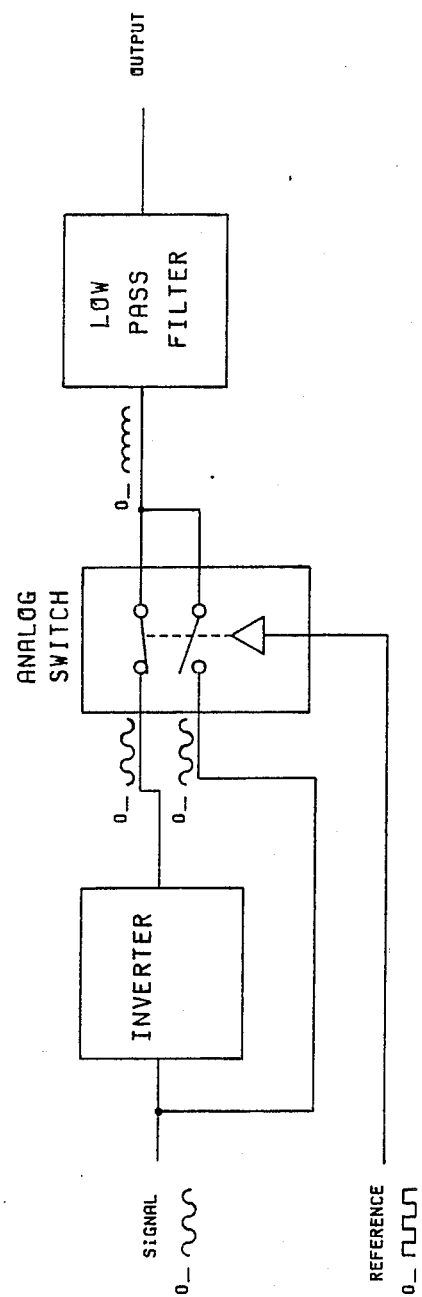
FIG. 1 illustrates for background a prior art synchronous detector.
Figure 2:
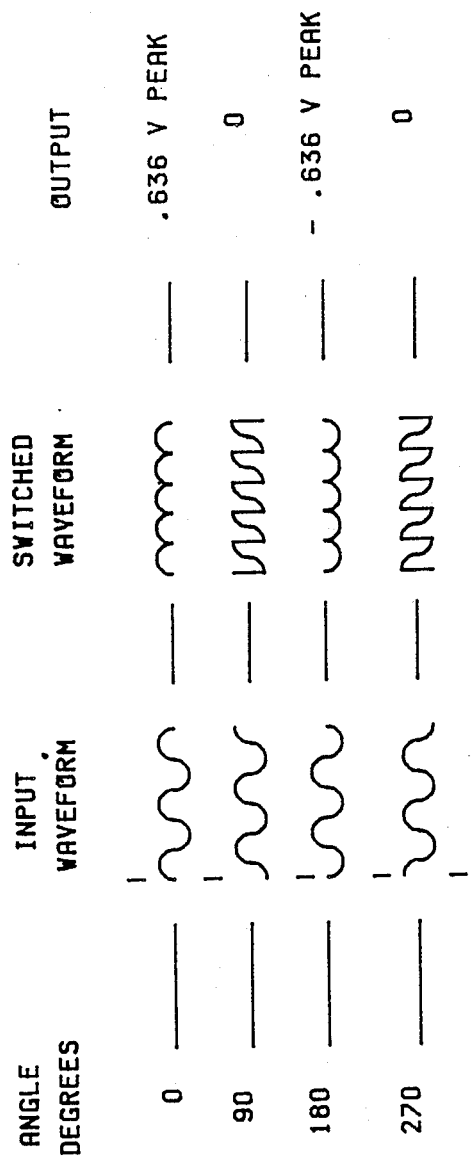
FIG. 2 shows the waveform for various values of the phase angle in the output of the FIG. 1 circuitry.
Figure 3:
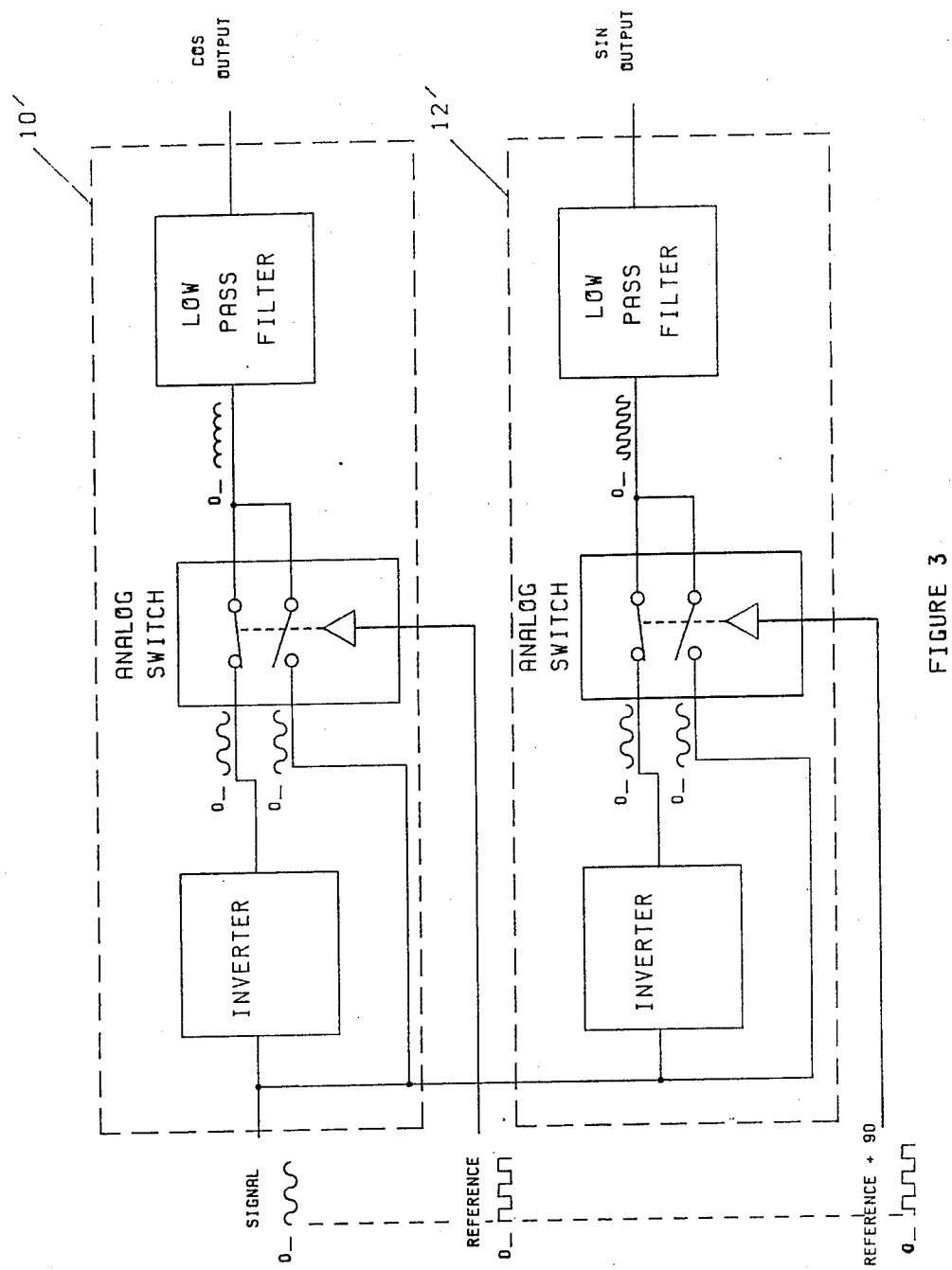
FIG. 3 illustrates for additional background another prior art synchronous detector circuit driven by both a reference signal and a reference plus 90 degrees signal.

Making reference to FIG. 4, two synchronous detectors 10, 12 are connected as in FIG. 4 followed by a chopper analog switch 14 followed by a RMS detector 16 connected to output 18. Detector 10 comprises that circuitry enclosed in dashed line 10' of FIG. 3 and detector 12 comprises that circuitry enclosed in dashed line 12' of FIG. 3. The chopper switch 14 alternately switches between the COS Output of synchronous detector 10 and the SIN Output of synchronous detector 12 at a frequency well above the highest frequency expected from the COS or SIN outputs. The chop signal is a square wave whose frequency is much higher than the highest frequency passed by the low-pass filters in the respective synchronous detectors 10, 12. A design value would be between 10 and 100 times the corner of each respective low-pass filter. Recognizing that a square wave gives equal periods, it is thus important both that the chop signal be square and that its frequency be much higher than that of the COS and SIN outputs of the respective synchronous detectors 10, 12.

The square wave shape adjustable reference signal 20 is fed to the synchronous detector 10 and the square wave shape adjustable reference plus 90 degrees signal 22 is fed to the synchronous detector 12. The square wave shape of the reference signal 20 combined with the analog switch 14 provide almost perfect multiplication of the input signal 24 by the reference signal 20 which is essential for the desired results. The input signal 24 to be detected is illustrated being fed to both synchronous detectors 10 and 12. The output of chopper switch 14 feeds to the RMS detector 16 which in turn feeds to output 18 which may be a visual display such as a meter or a connection into another system for further processing.

While illustrated as separate signal sources, a single signal source may be employed to provide both reference signal 20 and the reference plus 90° signal 22 as separate outputs of a suitably designed single signal source.

Since the chop frequency is well above the frequency of the respective COS and SIN outputs of synchronous detectors 10, 12, it can be shown that the RMS value of the waveform fed to RMS detector 16 is proportional to the magnitude of the input synchronous signal 24. It also turns out that the RMS value of the waveform fed to RMS detector 16 is also dynamically proportional to the magnitude of near synchronous signals. "Near" is defined here as those signals whose difference from the reference frequency is within the passband of the low-pass filter of the respective synchronous detectors 10, 12. In this case, the respective COS Output and the SIN Output of synchronous detectors 10, 12 are varying at that difference frequency. As previously stated, the chop signal is a square wave whose frequency is higher than the highest frequency passed by the low-pass filters of detectors 10, 12. The RMS value of the chopped waveforms thus represents the dynamic magnitude of the incoming signal. By "dynamic magnitude" is meant that the analog of the magnitude is available in real time following the change in the input signal magnitude. This means that what may be referred to as the pseudo-synchronous detector of the invention performs the function of demodulation of synchronous and near synchronous signals. This process retains all of the desirable characteristics of the basic synchronous detector.

A number of RMS detectors are available to perform the RMS function. These range all the way from the balanced thermal types to specialized integrated circuit implementations. There are several available integrated circuit true RMS detectors which have a wide dynamic range and high accuracy. It is thus relatively easy to construct a low frequency "pseudo" synchronous detector according to the invention with a dynamic range approaching 70 dB and an accuracy of $+/-1$ dB over that range. Thus, what I refer to here as the pseudo-synchronous detector of the invention allows the demodulation of signals over a narrow band with enormous rejection of unwanted signals. Also to be noted is that adjustability of the reference frequencies enables the center frequency of the pseudo-synchronous detector of the invention to be quickly changed.

I claim:

1. A detection circuit for detecting and determining the magnitude of a synchronous frequency signal whose phase relationship to a given reference frequency is known or unknown or a non-synchronous signal near the reference frequency, comprising:
   (a) a first synchronous detector;
   (b) a second synchronous detector;
   (c) a first signal source means providing:
      (i) a first signal comprising a first reference frequency fed to the input side of said first synchronous detector; and
      (ii) a second signal comprising a second reference frequency having a plus 90 degree phase relation to the first reference frequency, said second signal being fed to the input side of said second synchronous detector;
   (d) a second signal source means providing a third signal comprising a signal to be detected and whose magnitude is to be determined and characterized by being either a synchronous frequency signal whose phase relationship to the first reference frequency is known or unknown or a non-synchronous signal near the first reference frequency, said third signal being fed to the input sides of both said first and second synchronous detectors;
   (e) a chopper analog switch having two parallel single pole switches with input and output sides and one of which on its input side is connected to the output of the first synchronous detector and the other of which on its input side is connected to the output of the second synchronous detector;

(f) a RMS detector having input and output sides, the output sides of said single pole switches being connected to the input side of said RMS detector;

(g) a square wave driven chop frequency source connected to means operative to open and close said single pole switches at opposite times at said chop frequency, said chop frequency being higher than the output frequency of said synchronous detectors; and (h) wherein said first synchronous detector provides a COS Output, said second synchronous detector provides a SIN Output and said RMS detector provides an output indicative of the presence and magnitude of said third signal and if the relative phase of the input signal to the reference is "a" degrees, said COS and SIN outputs being defined by the relation COS $Output = 0.636 \times Peak\ Signal \times COS(a)$ and SIN $Output = 0.636 \times Peak\ Signal \times SIN(a)$.

2. A detection circuit as claimed in claim 1 wherein said first signal source means comprises separate signal sources for said first and second signals.

3. A detection circuit as claimed in claim 1 wherein said first and second reference frequencies are adjustable.

4. A detection circuit as claimed in claim 2 wherein said signal sources for said first and second signals are adjustable.

5. The method of detecting and determining the magnitude of a synchronous frequency signal whose phase relationship to a reference frequency is known or unknown or a non-synchronous signal near the reference frequency, comprising:

(a) establishing a network comprising:
  (i) first and second synchronous detectors with inputs and outputs;
  (ii) a first signal source means providing a first reference signal fed to the input of the first synchronous detector;
  (iii) a second signal source means providing a second reference signal plus 90 degrees out of phase with the first reference signal and fed to the input of the second synchronous detector; and
  (iv) means to sequentially connect the outputs of the first and second synchronous detectors to an RMS detector having an output for displaying a signal representative of the presence and magnitude of the signal sought to be detected;

(b) feeding the signal sought to be detected to the inputs of both said first and second synchronous detectors enabling the first synchronous detector to develop a Cosine Output expressed by the relation Cosine $Output = 0.636 \times Peak\ Signal \times COS(a)$ where (a) is the relative phase of the signal sought to be detected to the first reference signal and the second synchronous detector to develop a Sine Output expressed by the relation SIN $Output = 0.636 \times Peak\ Signal \times SIN(a)$; and (c) observing the signal produced by the RMS detector output as an indication of the presence and magnitude of the signal sought to be detected.

6. The method of claim 5 wherein said first and second signal source means are established as a single signal source providing both said first reference signal and said second reference signal.

7. The method of claim 5 wherein said sequential connection of the outputs of said first and second synchronous detectors is at a frequency substantially higher than the highest frequency of said COS and SIN outputs.

8. The method of claim 5 wherein said first and second signal sources provide respectively adjustable first and second reference signals.

9. The method of claim 7 wherein said sequential connection frequency is established by a square wave chop frequency source.

* * * * *